(12) United States Patent
Rosenbauer et al.

(10) Patent No.: US 7,764,472 B2
(45) Date of Patent: Jul. 27, 2010

(54) METHOD FOR CHECKING ELECTRICAL SAFETY OF A HOUSEHOLD APPLIANCE AND CORRESPONDING HOUSEHOLD APPLIANCE

(75) Inventors: Michael Rosenbauer, Reimlingen (DE); Bruno Reiter, Neresheim-Kösingen (DE); Reinhard Hering, Holzheim (DE); Christian Rothauszky, Medlingen (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 303 days.

(21) Appl. No.: 10/739,251

(22) Filed: Dec. 18, 2003

(65) Prior Publication Data

US 2004/0240136 A1   Dec. 2, 2004

Related U.S. Application Data

(63) Continuation of application No. PCT/EP02/06460, filed on Jun. 12, 2002.

(30) Foreign Application Priority Data

Jun. 26, 2001   (DE) ................. 101 30 606

(51) Int. Cl.
*H02H 3/16*   (2006.01)

(52) U.S. Cl. .......................... 361/42; 361/44

(58) Field of Classification Search ............. 361/42–50; 219/501

See application file for complete search history.

(56) References Cited

U.S. PATENT DOCUMENTS

| | | | | |
|---|---|---|---|---|
| 3,723,814 A | * | 3/1973 | Gross ......................... 361/45 |
| 4,370,692 A | * | 1/1983 | Wellman et al. ............ 361/109 |
| 4,687,906 A | * | 8/1987 | Fujishima et al. ........... 392/383 |
| 5,019,935 A | * | 5/1991 | Nakamura ................... 361/45 |
| 5,600,524 A | * | 2/1997 | Neiger et al. ................ 361/42 |
| 5,844,759 A | * | 12/1998 | Hirsh et al. ................. 361/42 |
| 5,943,199 A | * | 8/1999 | Aromin ....................... 361/42 |
| 6,111,733 A | * | 8/2000 | Neiger et al. ................ 361/42 |
| 6,522,510 B1 | * | 2/2003 | Finlay et al. ................ 361/42 |
| 6,795,285 B1 | * | 9/2004 | Jozwiak et al. .............. 361/45 |

FOREIGN PATENT DOCUMENTS

| | | |
|---|---|---|
| DE | 27 35 807 A1 | 2/1979 |
| DE | 199 40 988 A1 | 3/2001 |
| EP | 484698 A1 * | 5/1992 |
| EP | 0 838 192 A1 | 4/1998 |
| GB | 2 283 870 | 5/1995 |
| GB | 2 283 870 A | 5/1995 |

* cited by examiner

*Primary Examiner*—Danny Nguyen
(74) *Attorney, Agent, or Firm*—James E. Howard; Andre Pallapies

(57) ABSTRACT

A household appliance including at least one current sensor for measuring a fault current occurring in the appliance. A safety device which triggers a safety measure in the appliance in response to a predetermined detected fault current value.

19 Claims, 2 Drawing Sheets

METHOD FOR CHECKING ELECTRICAL SAFETY OF A HOUSEHOLD APPLIANCE AND CORRESPONDING HOUSEHOLD APPLIANCE

The invention relates to a process for checking the electrical safety of a household appliance, which has several electrical components as current consumers, as well as a corresponding household appliance.

Household appliances, for example dishwashing machines, which are known to have several current consumers such as pumps, heaters etc., usually do not feature an individual check of their electrical safety. Electrical safety is guaranteed only by the fault current circuit breaker known to be available in the household, in which the household appliance is arranged. This is not however adequate for monitoring the individual household appliances in most cases, since current circuits can normally be protected by fuse with several sockets via the known fault current circuit breakers. For this reason these fault current circuit breakers are set to greater current consumption and are too sluggish in their reaction to appliance-related problem cases. Such a problem case arises in particular through leak current, which can lead to electrical spikes and in the worst case to fire in the appliance between current-carrying components and the earthed conductor of the household appliance due to wetness or moisture.

The object of the invention therefore is to provide a process and a household appliance, by means of which the electrical safety of the household appliance can be better monitored in the simplest manner.

This task is solved according to the present invention with respect to the process by the features of claim 1 and with respect to the household appliance by the features of claim 9. Further developments of the invention are specified in the sub-claims.

The process according to the object of the present invention provides that at least one current sensor for measuring the reception of fault current is used in the household appliance and that a safety measure is triggered depending on the measured or detected current value.

The household appliance according to the object of the present invention has at least one current sensor for measuring the reception of fault current arranged directly in the household appliance and a control device for triggering a safety measure depending on the measured or detected current value.

Figure 1:
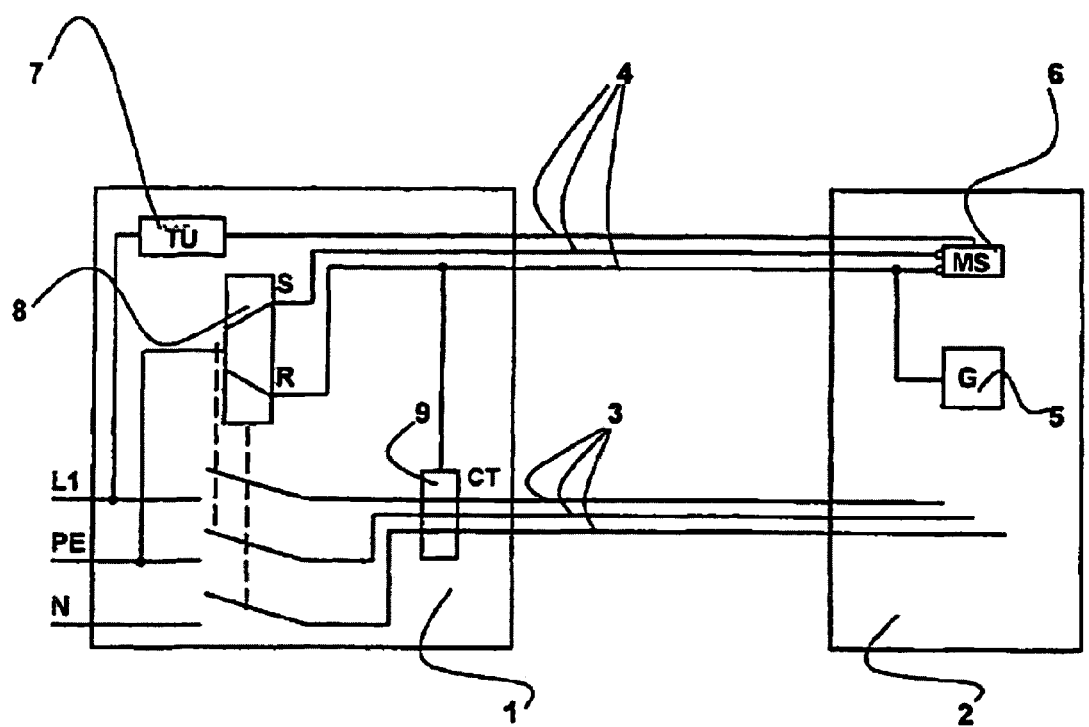
Figure 2:
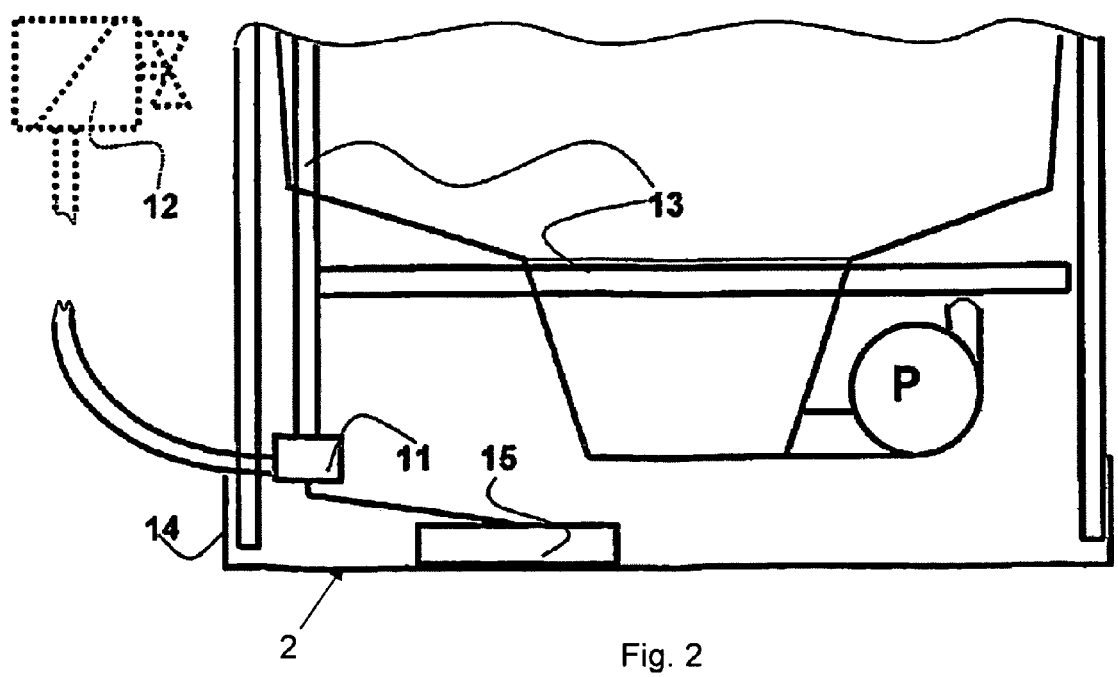

The invention will now be explained in greater detail with reference to an arrangement for executing the method of the present invention illustrated in the figures of the drawings, in which:

FIG. 1 is a circuit plan of an arrangement for executing the method of the present invention in connection with the operation of a household appliance in the form of a dishwasher; and FIG. 2 is a front elevational sectional view of a portion of the dishwasher shown in FIG. 1 and showing a control panel of the dishwasher FIG. 1 is a circuit plan of an arrangement for executing the method of the present invention in connection with the operation of a household appliance in the form of a dishwasher, wherein FIG. 1 shows a mains plug 1 which is connected to a dishwashing machine 2 via electric conductor bundles 3 and 4. The conductor bundles 3 lead from the mains plug 1 to the electrical consumers, such as for example motors or heaters, the conductor bundles 4 lead from the mains plug 1 to the main switch, which can e.g. be designed as four-way operation buttons. The conductor bundles 4 are configured as low voltage conductors. Arranged in the floor region of the dishwashing machine 2 in the illustrated embodiments is a gas sensor 5, assigned to which is a gas sensor circuit, and is connected by way of electric conductors to the main switch 6, so that when a signal of the gas sensor 5 is emitted the main switch 6 interrupts the main current circuit and the dishwashing machine 2 is them without current. Provided in the mains plug 1 is a transformer unit 7, which transforms incoming 230 V alternating current to a low voltage via flexible cord L1. In addition, a relay 8 is provided in the mains plug 1, which is connected via both channels R and S to the main switch 6. With the signal induced by the main switch 6 to channel S the relay 8 closes and switches on the dishwashing machine 2, and with the signal to channel R opens the relay 8 and disconnects the dishwashing machine 2. Located in the main current circuit, which is built up essentially by the conductor bundles 3, is a cumulative current transformer 9, which constantly measures the sum of all currents and from a certain deviation, which is attributable for example to a fault current, sends a signal to the reset inlet—channel R—of the relay 8, so that finally the main switch 6 of the dishwashing machine 2 disconnects.

FIG. 2 is a front elevational sectional view of a portion of the dishwasher 2 shown in FIG. 1 and the electric supply of the aquiferous domestic appliance 2 is controlled via a relay (not shown) and the relay is activated by response from the gas sensor 5, so that all components of the domestic appliance 2 are cut off from the mains supply. At the same time a reversing valve 11 is actuated, so that water can flow into a loop line 13. The loop line 13 is arranged advantageously in the interior of the domestic appliance such that all combustible material can be wetted by a generated spray mist.

The loop line 13 is designed effectively as an inflammable line and is guided to all endangered components, whereby nozzles are provided in the loop line 13 at the critical sites through which water or a water mist can escape. Water is sprayed through the loop line 13 until such time as a preset switch level is reached in a base pan 14 and a float 15 positioned therein blocks off a shut-off valve 12, which regulates the water supply to the domestic appliance, (indicated in FIG. 2 by dotted lines).

As seen in FIG. 2, a control panel 100 of the dishwasher 2 includes a signal device 102 for emitting at least one of an acoustic or an optical warning signal in the event that a predetermined fault current value is exceeded.

Through the arrangement according to the present invention of a current sensor directly in the household appliance the permissible reception of fault current can be measured directly—quasi on site—and appliance-specifically, so that the safety measure can be triggered automatically depending on this measured parameter, preferably according to evaluation by a control device of the household appliance. The result therefore is substantially improved electrical safety of the household appliance itself relative to fault current circuit breakers, which are not optimised individually to the appliances themselves according to usual domestic installation technology for the entire household. No longer does it depend in particular on the house fuses, which are incapable of detecting individual appliance-dependent spikes in current consumption, caused e.g. inter alia by particularly dangerous leak current due to the danger of fire, as is possible with the invention. By means of the invention a process and a household appliance are created, by means of which the electrical safety of the household appliance can be better monitored in the simplest manner.

A particularly favourable, simple and economical variant of the invention provides that the reception of fault current is measured on the earthed conductor of the household appliance by the current sensor and compared to a preset reference value, and that when the reference value is exceeded the safety measure is triggered. The current sensor is preferably arranged on an input of the mains supply.

An alternative to the abovementioned solution according to a further development of the invention is that the reception of fault current is measured on a radio interference suppression coil of the household appliance by the current sensor and that in the event of a difference in at least one of both currents the safety measure is triggered by both coils of the radio interference suppression coil relative to a reference value. According to another preferred embodiment of the invention the radio interference suppression coil acts as a current sensor for the reception of fault current, and the currents in both coils of the radio interference suppression coil are measured or detected and the safety measure is triggered in the event of a difference between both currents relative to a reference difference parameter. These variants are consequently particularly favourable, because no additional expenditure for measuring the reception of fault current directly in the household appliance is necessary, and thus costs are saved by the already available radio interference suppression coil, e.g. for reasons of electromechanical tolerance (EMT).

According to another advantageous variant of the invention a fault current circuit breaker is incorporated into the household appliance and used as a current sensor. In this way proven monitoring means for increasing the electrical safety can also be employed individually in the household appliance.

The preferred safety measures according to alternative further developments of the invention comprise the household appliance being cut off, and one or more electrical components being cut off or an acoustic and/or an optical warning signal being emitted on the household appliance.

The process according to the present invention preferably can be used advantageously for any aquiferous household appliances, though for dishwashing machines in particular. For accommodating rinse ware the dishwashing machine has the largest possible rinse container, which can be opened and closed by an appliance door. A control device, which e.g. also controls the cycle of an automatically running program selected by the operator of the dishwashing machine, can evaluate the reception of fault current measured by each current sensor arranged directly in the household appliance and trigger the safety measure depending on this measured parameter. When a current sensor is used, which determines the reception of fault current on the earthed conductor present in the dishwashing machine and which is preferably arranged on an input of the mains supply, the control device compares the measured parameter to a reference value and then triggers the safety measure, whenever the reference value is exceeded.

The method of operation works differently when the radio interference suppression coil of the household appliance already located in the dishwashing machine is used for fault current reception, whereby when a difference is detected in at least one of the two currents by both the coils of the radio interference suppression coil as opposed to one only, likewise presettable reference value the safety measure is triggered. If the actual current—recognisable on the current value measured by one or the other coil—exceeds the permitted reference value as safety parameter—optionally under consideration of a presettable tolerance parameter raised increased compared to the normal reception of fault current—the entire dishwashing machine or individual electrical components can be automatically cut off as current consumers or at least an acoustic and/or optical warning signal can be emitted on the control panel located above the door of the dishwashing machine.

The process becomes simplified even further when the radio interference suppression coil itself acts as current sensor for the reception of fault current according to another preferred embodiment of the invention. The currents are measured or detected in both coils of the radio interference suppression coil at the same time. In the event of a difference between both currents said difference is compared to a reference difference parameter and the safety measure is triggered when there is a difference compared to a reference difference parameter.

Incorporating a fault current circuit breaker known per se from domestic installation technology, which is however incorporated into the dishwashing machine for appliance-specific monitoring, in order to measure the reception of fault current as current sensor directly on site and to transmit it to the control device for evaluation for a possible triggering of one of the safety measures, is another feasible variant of a current sensor.

The invention effectively produces a process and a household appliance, by means of which the electrical safety of the household appliance can be better monitored in the simplest manner.

The invention claimed is:

1. A process of checking the electrical safety of a household appliance, which appliance includes several electrical components as current consumers, comprising:
    monitoring an earthed conductor of said household appliance with a current sensor at least during an operating period of the household appliance when two other conductors are carrying current and any current carried by said earthed conductor has a magnitude less than a measurable current, with the measurable current in said earthed conduct being a current that flows in the earthed conductor in the event of a malfunction;
    in the event of the measurable current flowing in said earthed conductor, comparing a value of the measurable current in said earthed conductor with a predetermined reference value; and
    initiating a safety procedure when said predetermined reference value is exceeded, wherein said predetermined reference value is adapted individually to said household appliance.

2. The process according to claim 1, including locating said fault current sensor on said earthed conductor on an input of the mains plug of an electrical supply of said appliance.

3. The process according to claim 1, including incorporating a current circuit breaker into said household appliance for initiating said safety procedure.

4. The process according to claim 1, wherein said initiating of said safety procedure includes deenergizing at least one of the electrical components.

5. The process according to claim 1, wherein said initiating of said safety procedure includes deenergizing at least one of the electrical components.

6. The process according to claim 1, including said household appliance is an aquiferous household appliance.

7. The process according to claim 1, including said household appliance is a dishwashing machine.

8. A process of checking the electrical safety of a household appliance, which appliance includes several electrical components as current consumers, comprising:
    measuring a current entering the household appliance using a radio frequency interference device having at least two coils by measuring the current on both coils of said radio frequency interference device;

comparing each of said measured current values with a predetermined reference value; and initiating a safety procedure in response to said predetermined reference value being exceeded by said measured current values on both coils wherein said predetermined reference value is adapted individually to said household appliance.

9. The process according to claim 8, wherein said radio frequency interference device acts as said current sensor for measuring said current in both of said coils and initiates said safety procedure when a difference between said two measured current values exceeds a predetermined reference value.

10. A household appliance, comprising:

several current consuming electrical components; and a current sensor that measures a current entering the household appliance on an earthed conductor wherein the measurable current is unexpected and that initiates a safety procedure upon measuring the current value that exceeds a predetermined fault current value, wherein said predetermined fault current value is optimized individually to said household appliance.

11. The household appliance according to claim 10, wherein said current sensor measuring said current is on the earthed conductor of said household appliance.

12. The household appliance according to claim 11, wherein said current sensor is on an input of the mains plug of an electrical supply of said appliance.

13. The household appliance according to claim 10, wherein said current sensor is located on a radio frequency interference device having at least two coils and that measures a current on both coils of said radio frequency interference device and that compares each of said measured current values with a predetermined reference value and that initiates said safety procedure on both coils when said predetermined reference value is exceeded by said measured current values on both coils.

14. The household appliance according to claim 13, including said radio frequency interference device forming said current sensor.

15. The household appliance according to claim 10, including a fault current circuit breaker incorporated into said household appliance that measures the reception of said current.

16. The household appliance according to claim 10, wherein said safety procedure includes deenergizing at least one of the electrical components.

17. The household appliance according to claim 10, wherein said safety procedure includes emitting one of an acoustic or an optical warning signal from said household appliance.

18. The household appliance according to claim 10, including said household appliance is an aquiferous household appliance.

19. The household appliance according to claim 10, including said household appliance is a dishwashing machine.

* * * * *